United States Patent
Hortaleza et al.

(10) Patent No.: US 6,182,882 B1
(45) Date of Patent: Feb. 6, 2001

(54) ANGLED TRANSDUCER-DUAL HEAD BONDER FOR OPTIMUM ULTRASONIC POWER APPLICATION AND FLEXIBILITY FOR TIGHT PITCH LEADFRAME

(75) Inventors: Edgardo R. Hortaleza; Willmar E. Subido, both of Garland, TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/542,005

(22) Filed: Apr. 3, 2000

Related U.S. Application Data

(62) Division of application No. 09/178,843, filed on Oct. 26, 1998.
(60) Provisional application No. 60/063,909, filed on Oct. 31, 1997.

(51) Int. Cl.[7] .............................. B23K 1/00; B23K 1/19; B23K 37/00
(52) U.S. Cl. .............................. 228/4.5; 228/25; 228/33; 228/49.1; 219/85.18
(58) Field of Search .............................. 228/4.5, 25, 33, 228/49.1, 180.5, 244; 219/85.18

(56) References Cited

U.S. PATENT DOCUMENTS

| | | | |
|---|---|---|---|
| 5,316,204 | * | 5/1994 | Takehashi et al. ............... 228/179.1 |
| 5,495,976 | * | 3/1996 | Mironesco et al. ............... 228/110.1 |
| 5,537,737 | * | 7/1996 | Kamakura et al. ................... 29/827 |
| 5,544,804 | * | 8/1996 | Test et al. ........................ 228/180.5 |
| 5,702,049 | * | 12/1997 | Biggs et al. ........................ 228/105 |
| 5,735,449 | * | 4/1998 | Magni ................................ 228/180.5 |
| 5,944,249 | * | 8/1999 | Macabitas et al. ............... 228/180.5 |

FOREIGN PATENT DOCUMENTS 6-69290 * 4/1994 (JP) .

* cited by examiner

*Primary Examiner*—Patrick Ryan
*Assistant Examiner*—Colleen Cooke
(74) *Attorney, Agent, or Firm*—Wade James Brady, III; Frederick J. Telecky, Jr.

(57) ABSTRACT

A method of bonding wire between at least one pair of bond locations in a semiconductor device and the bonder. A conveyor is provided having a conveying surface for conveying in a predetermined direction a partially fabricated semiconductor device having first and second bonding locations. A first capillary is provided for forming a stitch bond to the first bonding location, the first capillary being disposed at an angle of about 45 degrees with respect to the predetermined direction and a line normal thereto and substantially parallel to the plane of the conveying surface. A stitch bond is formed on the first bonding location with the first capillary. The first capillary is at an angle of substantially 45 degrees with respect to a line normal to the plane of the conveying surface. A second capillary is provided for forming a stitch bond to the second bonding location, the second capillary being disposed at an angle of about 45 degrees with respect to the predetermined direction and a line normal to the predetermined direction and substantially parallel to the plane of the conveying surface and a stitch bond is formed on the second bonding location with the second capillary. The second capillary is at an angle of substantially 45 degrees with respect to the plane of the conveying surface. The first and second capillaries are disposed at an angle of about 90 degrees with respect to each other with respect to each other in a direction normal to said plane.

10 Claims, 1 Drawing Sheet

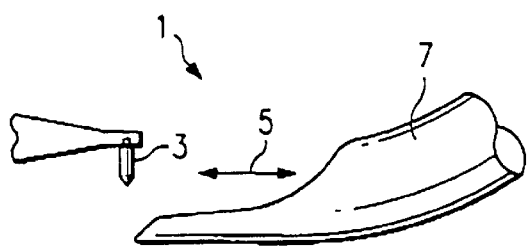
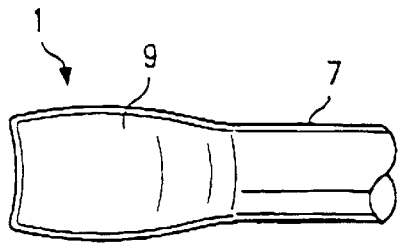
FIG. 1a    FIG. 1b
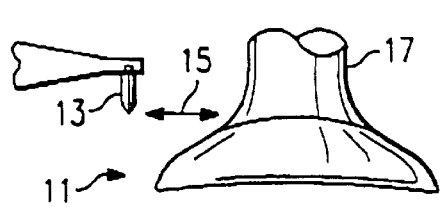
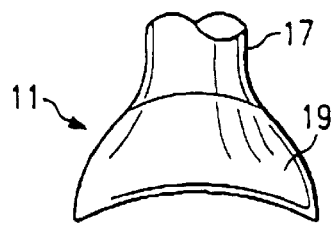
FIG. 2a    FIG. 2b
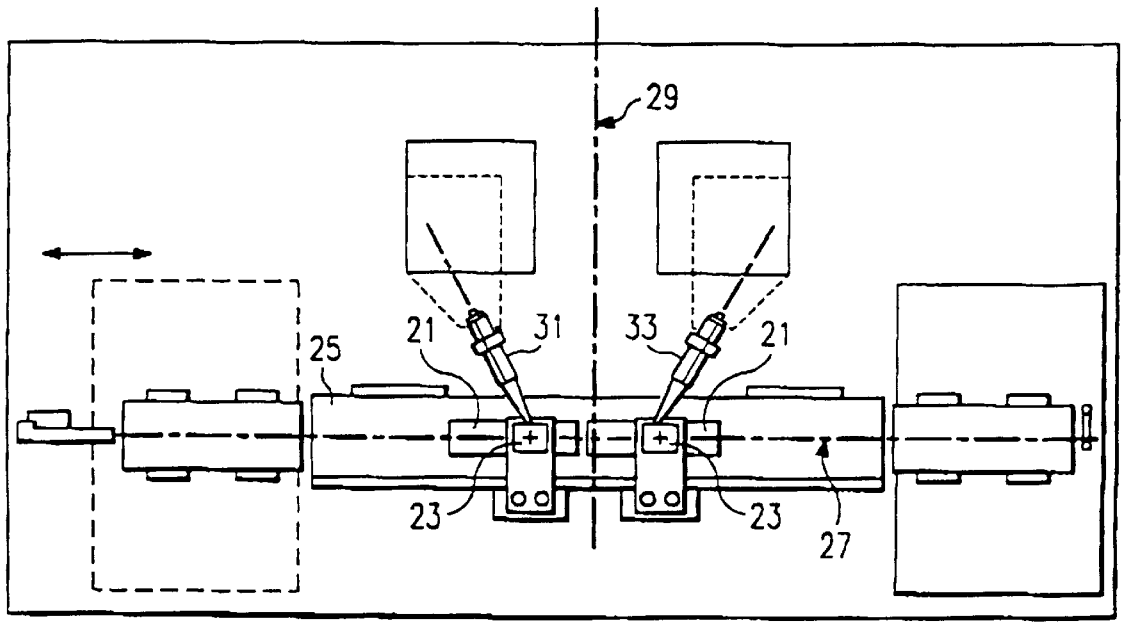
FIG. 3

ANGLED TRANSDUCER-DUAL HEAD BONDER FOR OPTIMUM ULTRASONIC POWER APPLICATION AND FLEXIBILITY FOR TIGHT PITCH LEADFRAME

CROSS REFERENCE TO PRIOR APPLICATIONS

This application is a Div. of Ser. No. 09/178,843 filed Oct. 26, 1998 which, claims priority under 35 U.S.C. 119(e) based upon Provisional Application Ser. No. 60/063,909, filed Oct. 31, 1997.

BACKGROUND OF THE INVENTION

1. Field of the Invention

This invention relates to wire bonders and a method of wire bonding.

2. Brief Description of the Prior Art

In the fabrication of semiconductor devices, one of the generally required procedures is that of bonding wire between a pair of wire bonding locations, these wire bond location usually involving bond pads on a semiconductor chip and lead fingers of a lead frame. This procedure is generally accomplished by providing a ball bond onto the bond pad of the semiconductor chip and a stitch bond onto the lead finger of the lead frame, both of which are provided, at least in part, using ultrasonic or thermosonic heating techniques.

With the increasing demand for lower temperature thermosonic bonding processes, the stitch bonds become increasingly critical from the standpoint of reliability. Due to the inherent motion of ultrasonic energy being parallel to the axis of the ultrasonic transducer which provides the ultrasonic energy, wires bonded in a direction normal to the axis of the ultrasonic transducer have relatively high stitch flare area (meaning that the stitch bond spreads out on the surface to which the bond is being made) and have relatively high tensile strength as compared with stitch bonds formed wherein the ultrasonic energy moves in a direction parallel to the wire bonding direction, such bonds displaying relatively low tensile strength and having a relatively smaller stitch area.

To compensate for this known effect, in the prior art, the ultrasonic power bond force and bond time are programmed to vary, depending upon the wire angle or position with respect to the axis of the ultrasonic transducer. However, this approach fails to provide the optimum solution since the direction of the ultrasonic energy still remains the same, namely normal or with a component normal to the direction of the ultrasonic energy.

SUMMARY OF THE INVENTION

In accordance with the present invention, the above described problem of the prior art is minimized and there is provided a bonding method and apparatus which can provide bonds with required tensile strength regardless of the direction of travel of the capillary through which the ultrasonic energy is provided relative to the direction in which the stitch bond is made.

Briefly, the above is accomplished by positioning the transducers at right angles to each other and at a 45 degree angle relative to the x and y axes, with the x and y axes lying in the plane of the surface to which the stitch bond is to be made. This allows half of the array of wires to be normal to each transducer and addresses the above discussed limitation of the prior art and current wire bonders. This approach also provides more flexibility for low pitch lead frames by allowing the bond heads to be capable of being closer to each other without mechanical interference.

More specifically, a plurality of lead frames, each with a semiconductor chip thereon, move along a conveyor in an "x-axis" direction wherein the "y-axis" and "x-axis" both lie essentially in the same plane as that of the lead frame and chip. The "z-axis" is normal to the x and y axes. A pair of bonding capillaries which are each movable in each of the x, y and z axes, are positioned to deliver ultrasonic energy therethrough to wires to be stitch bonded in standard manner. Each of the capillaries is mounted to make an angle of substantially 45 degrees with each of the x and y axes. The angle made between the axis of each capillary and the z-axis can be from 0 to 90 degrees and is preferably about 45 degrees with the axes of the capillaries preferably extending in opposite directions such that the mouths of the capillaries through which wire is ejected face toward each other. This provides flexibility for tight pitch lead frames, flexibility for "stud bumping" on the wafer level and flexibility to optimize the capabilities of the transducers.

BRIEF DESCRIPTION OF THE DRAWINGS

FIGS. 1a and 1b are schematic diagrams showing a stitch bond being made using a transducer wherein the wire axis is parallel to the transducer axis;

FIGS. 2a and 2b are schematic diagrams showing a stitch bond being made using a transducer wherein the wire axis is normal to the transducer axis; and FIG. 3 is a schematic diagram of a bonder with bond heads in accordance with the present invention.

DESCRIPTION OF THE PREFERRED EMBODIMENT

Referring first FIGS. 1a and 1b, there is shown schematically a stitch bond 1 wherein a standard bonding capillary 3 has made the stitch bond and is moving along the direction of the axis 5 of the wire 7 being stitch bonded with the ultrasonic energy also being directed along the wire axis. The stitch bond 1 formed has an elongated stitch area 9 with a relatively small area of contact to the bonding location to which it is bonded.

Referring to FIGS. 2a and 2b, there is shown schematically a stitch bond 11 wherein a standard bonding capillary 13 has made the stitch bond and is moving in the direction normal to the axis 15 of the wire 17 being stitch bonded with the ultrasonic energy also being directed in the direction normal to the axis of the wire. The stitch bond 11 formed has a stitch area 19 which is much larger than the stitch area formed when using the procedures discussed above in connection with FIGS. 1a and 1b.

Referring now to FIG. 3, there is shown a schematic diagram of a bonding apparatus in accordance with the present invention. There are shown a plurality of lead frames 21, each with a semiconductor chip 23 thereon, both lead frames moving along a conveyor 25 in an "x-axis" direction 27. The "y-axis" 29 and "x-axis" 27 both lie essentially in the same plane as that of the lead frame 21 and chip 23 which is the plane of the paper showing FIG. 3. The "z-axis" as shown in FIG. 3 is normal to the x and y axes and the plane of the paper showing FIG. 3. A pair of bonding capillaries 31 and 33, each movable in each of the x, y and z axes, is positioned to deliver ultrasonic energy therethrough to the wire (not shown in FIG. 3) to be bonded in standard manner. Each of the capillaries 31, 33 is mounted to make an angle of substantially 45 degrees with each of the x and y axes. The angle between the axis of each capillary 31 and 33 made with the z-axis is preferably 45 degrees with the axes of the capillaries preferably being 90 degrees apart and extending in opposite directions such that the mouths of the capillaries through which the wire is ejected face toward each other. As can be seen in FIG. 3, as the lead frames 21 travel from left to right, for example, a stitch bond can be provided by capillary 31 onto a semiconductor chip 21 or lead frame finger and, as that lead frame and chip now move to capillary 33, capillary 33 can make a stitch bond on an adjacent location on the chip or lead frame finger without interfering with the prior stitch bond, this resulting from the fact that capillary 33 is angled in a direction opposed to that of capillary 31. The above described arrangement provides flexibility for tight pitch lead frames, flexibility for "stud bumping" on the wafer level and flexibility to optimize the capabilities of the transducers.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A bonder for bonding wire between at least one pair of bond locations in a semiconductor device which comprises:
   (a) a conveyor having a conveying surface for conveying in a predetermined direction a partially fabricated semiconductor device having a first bonding location; and
   (b) a first capillary for forming a stitch bond to said first bonding location, said first capillary being disposed at an angle of about 45 degrees with respect to said predetermined direction and a line normal to said predetermined direction and substantially parallel to the plane of said conveying surface.

2. The bonder of claim 1 wherein said first capillary is at an angle of substantially 45 degrees with respect to a line normal to said plane of said conveying surface.

3. The bonder of claim 1 wherein said partially fabricated semiconductor device includes has a second bonding location, further including a second capillary for forming a stitch bond to said second bonding location, said second capillary being disposed at an angle of about 45 degrees with respect to said predetermined direction and a line normal to said predetermined direction and substantially parallel to the plane of said conveying surface.

4. The bonder of claim 2 wherein said partially fabricated semiconductor device includes has a second bonding location, further including a second capillary for forming a stitch bond to said second bonding location, said second capillary being disposed at an angle of about 45 degrees with respect to said predetermined direction and a line normal to said predetermined direction and substantially parallel to the plane of said conveying surface.

5. The bonder of claim 3 wherein said second capillary is at an angle of substantially 45 degrees with respect to a line normal to said plane of said conveying surface.

6. The bonder of claim 4 wherein said second capillary is at an angle of substantially 45 degrees with respect to a line normal to said plane of said conveying surface.

7. The bonder of claim 3 wherein said first and second capillaries are disposed at an angle of about 90 degrees with respect to each other with respect to a line normal to said plane.

8. The bonder of claim 4 wherein said first and second capillaries are disposed at an angle of about 90 degrees with respect to each other with respect to a line normal to said plane.

9. The bonder of claim 5 wherein said first and second capillaries are disposed at an angle of about 90 degrees with respect to each other with respect to a line normal to said plane.

10. The bonder of claim 6 wherein said first and second capillaries are disposed at an angle of about 90 degrees with respect to each other with respect to a line normal to said plane.

* * * * *